(12) United States Patent
Lee et al.

(10) Patent No.: US 9,159,651 B2
(45) Date of Patent: Oct. 13, 2015

(54) SEMICONDUCTOR PACKAGES HAVING TSV AND ADHESIVE LAYER

(71) Applicant: Samsung Electronics Co., Ltd., Suwon-si, Gyeonggi-do (KR)

(72) Inventors: Teak-Hoon Lee, Hwasung-si (KR); Ji-Hwang Kim, Bucheon-si (KR); Sang-Wook Park, Hwasung-si (KR); Young-Kun Jee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 102 days.

(21) Appl. No.: 14/041,169

(22) Filed: Sep. 30, 2013

(65) Prior Publication Data

US 2014/0291854 A1     Oct. 2, 2014

(30) Foreign Application Priority Data

Apr. 1, 2013   (KR) .................. 10-2013-0035316

(51) Int. Cl.
| | |
|---|---|
| *H01L 23/40* | (2006.01) |
| *H01L 23/52* | (2006.01) |
| *H01L 29/40* | (2006.01) |
| *H01L 23/48* | (2006.01) |

(52) U.S. Cl.
CPC ............ *H01L 23/481* (2013.01); *H01L 2224/13* (2013.01); *H01L 2224/73204* (2013.01); *H01L 2924/15174* (2013.01); *H01L 2924/15311* (2013.01)

(58) Field of Classification Search
USPC .................. 257/686, 685, 723, 726, 257/E23.169–E23.178; 438/6, 28, 66, 67, 438/107, 109, 406
See application file for complete search history.

(56) References Cited

U.S. PATENT DOCUMENTS

| | | | |
|---|---|---|---|
| 6,353,263 B1 | 3/2002 | Dotta et al. | |
| 7,352,068 B2 | 4/2008 | Kuroda et al. | |
| 8,114,707 B2 | 2/2012 | Farooq et al. | |
| 2008/0251936 A1 | 10/2008 | Kuroda | |
| 2010/0038769 A1* | 2/2010 | Baek et al. | 257/686 |
| 2010/0237484 A1* | 9/2010 | Han et al. | 257/686 |
| 2011/0057327 A1* | 3/2011 | Yoshida et al. | 257/777 |
| 2011/0291267 A1 | 12/2011 | Wang et al. | |
| 2012/0018871 A1 | 1/2012 | Lee et al. | |
| 2012/0056334 A1* | 3/2012 | Yang et al. | 257/777 |
| 2012/0088332 A1* | 4/2012 | Lee et al. | 438/113 |

FOREIGN PATENT DOCUMENTS

| | | |
|---|---|---|
| JP | 3669986 B2 | 4/2005 |
| KR | 2000-0040586 A | 7/2000 |
| KR | 2001-0017869 A | 3/2001 |
| KR | 10-0792145 B1 | 12/2007 |
| KR | 10-2009-0036948 A | 4/2009 |

* cited by examiner

*Primary Examiner* — Dao H Nguyen
*Assistant Examiner* — Tram H Nguyen
(74) *Attorney, Agent, or Firm* — Myers Bigel Sibley & Sajovec, P.A.

(57) ABSTRACT

A semiconductor package includes a first semiconductor chip on a substrate and having a plurality of through-silicon vias (TSVs). A second semiconductor chip having an active layer is on the first semiconductor chip. An adhesive layer is between the first semiconductor chip and the active layer. Connection terminals extend through the adhesive layer and are connected to the TSVs and the active layer. Side surfaces of the adhesive layer are aligned with side surfaces of the second semiconductor chip.

16 Claims, 18 Drawing Sheets

SEMICONDUCTOR PACKAGES HAVING TSV AND ADHESIVE LAYER

CROSS-REFERENCE TO RELATED APPLICATION

This U.S. non-provisional patent application claims priority under 35 U.S.C. §119 to Korean Patent Application No. 10-2013-0035316 filed on Apr. 1, 2013, the entirety of which is hereby incorporated herein by reference.

BACKGROUND

Embodiments of the inventive concepts provide semiconductor packages including a through-silicon via (TSV), and methods of forming the same.

Due to the increased demand for lightweight, thin, and small-sized electronic systems, research has widely been conducted on techniques of mounting a plurality of semiconductor chips in a single package.

SUMMARY

Embodiments of the inventive concepts can provide a semiconductor package and a method of forming the same, which may simplify a forming process and precisely adhere a lower semiconductor chip and an upper semiconductor chip to each other.

The technical objectives of the inventive concepts are not limited to the above disclosure; other objectives may become apparent to those of ordinary skill in the art based on the following description.

In accordance with an aspect of the inventive concepts, a semiconductor package includes a first semiconductor chip on a substrate and having a plurality of through-silicon vias (TSVs). A second semiconductor chip is on the first semiconductor chip remote from the substrate and has an active layer. An adhesive layer is between the first semiconductor chip and the active layer. Connection terminals extend through the adhesive layer and are connected to the TSVs and the active layer. Side surfaces of the adhesive layer are aligned with side surfaces of the second semiconductor chip.

The side surfaces of the adhesive layer may be vertically aligned with the side surfaces of the second semiconductor chip.

The second semiconductor chip may have a greater horizontal width than or the same horizontal width as the first semiconductor chip. The adhesive layer may have the same horizontal width as the second semiconductor chip.

The second semiconductor chip may have a smaller horizontal width than the first semiconductor chip. The adhesive layer may include a protrusion extending outside the second semiconductor chip.

The protrusion of the adhesive layer may extend to a higher level than a bottom end of the second semiconductor chip. The protrusion of the adhesive layer may be spaced apart from side surfaces of the second semiconductor chip.

Upper electrodes may be provided between the TSVs and the connection terminals and in contact with the connection terminals through the adhesive layer. A respective upper electrode may have an upper portion having a smaller horizontal width than a lower portion thereof. The connection terminals may be in contact with top surfaces and side surfaces of the upper electrodes.

Lower electrodes may be provided between the connection terminals and the active layer and in contact with the connection terminals. The adhesive layer is in contact with side surfaces of the connection terminals and the lower electrodes.

Pores may be provided between the adhesive layer and the active layer. The pores may be near the connection terminals, and side surfaces of the connection terminals may be exposed within the pores.

Each of the connection terminals may include a solder ball, a conductive bump, or a combination thereof.

A thermal interface material (TIM) layer may be on the second semiconductor chip. A heat slug may be on the TIM layer.

The adhesive layer is on, and in some embodiments may cover, the side surfaces of the first semiconductor chip.

An under-fill material may be provided between the substrate and the first semiconductor chip. Lower connection terminals may be connected to the substrate and the TSVs through the under-fill material.

In accordance with another aspect of the inventive concepts, a semiconductor package includes a plurality of first semiconductor chips vertically stacked on a substrate and having a plurality of through-silicon vias (TSVs). First adhesive layers are provided between a lowermost first semiconductor chip of the first semiconductor chips and the substrate, and between the first semiconductor chips. First connection terminals are connected to the TSVs through the first adhesive layers. A second semiconductor chip is on an uppermost first semiconductor chip of the first semiconductor chips and has an active layer. A second adhesive layer is provided between the uppermost first semiconductor chip and the active layer. Second connection terminals are connected to the TSVs and the active layer through the second adhesive layer. The second semiconductor chip has a different horizontal width than the first semiconductor chips. Side surfaces of the first adhesive layers are aligned with side surfaces of the first semiconductor chips, and side surfaces of the second adhesive layers are aligned with side surfaces of the second semiconductor chip.

In accordance with yet other aspects of the inventive concepts, a semiconductor package comprises a substrate, and a first semiconductor chip on the substrate and having a plurality of conductive vias extended therethrough. A second semiconductor chip is on the first semiconductor chip remote from the substrate, the second semiconductor chip being wider than the first semiconductor chip. An adhesive layer is on the second semiconductor chip and extends on the second semiconductor chip beyond the first semiconductor chip. A plurality of connection terminals are provided in the adhesive layer that electrically connect the second semiconductor chip to the plurality of conductive vias that extend through the first semiconductor chip.

The adhesive layer may extend on the second semiconductor chip to align with a side of the second semiconductor chip.

The first semiconductor chip may be a logic chip and the second semiconductor chip may be a memory chip.

In other embodiments, the semiconductor package further comprises a plurality of second electrodes on the first semiconductor chip adjacent the second semiconductor chip, a respective one of which is connected to a respective one of the conductive vias and a respective one of the first electrodes. The respective second electrodes have nonplanar surfaces adjacent the respective first electrodes and the respective first electrodes have planar surfaces adjacent the respective second electrodes. The second electrodes may comprise a base and a protrusion extending from the base towards the respective first electrodes, the protrusion being narrower than the base. A plurality of solder bumps may be provided, a respective one of which is between a respective one of the first electrodes and a respective one of the second electrodes.

Specific particulars of other embodiments are included in detailed descriptions and drawings.

BRIEF DESCRIPTION OF THE DRAWINGS

The foregoing and other features and advantages of the inventive concepts will be apparent from the more particular description of various embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE EMBODIMENTS

Figure 1A:
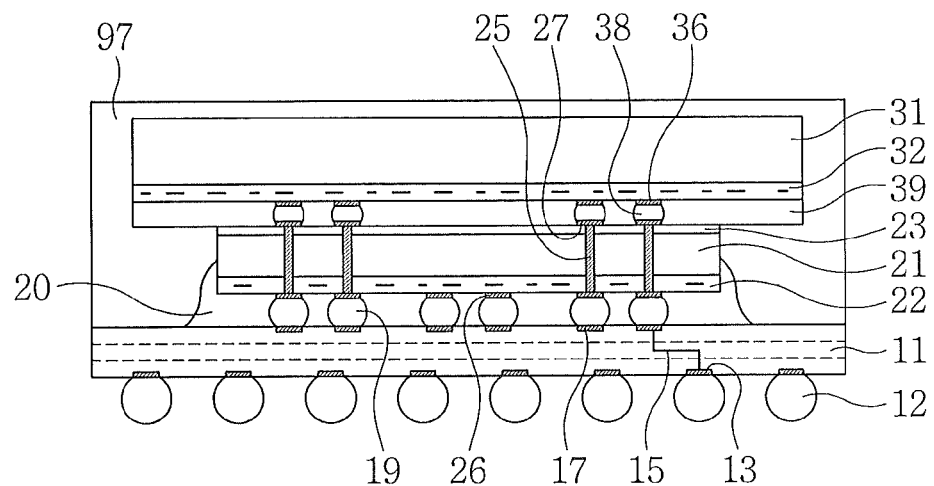
FIGS. 1A through 2K are cross-sectional views and layouts of a semiconductor package according to embodiments of the inventive concepts.

Various embodiments will now be described more fully with reference to the accompanying drawings in which some embodiments are shown. The inventive concepts may, however, be embodied in different forms and should not be construed as limited to the embodiments set forth herein. Rather, these embodiments are provided so that this disclosure is thorough and complete and fully conveys the scope of the inventive concepts to those skilled in the art. In the drawings, the thicknesses of layers and regions may be exaggerated for clarity. It will also be understood that when a layer is referred to as being "on" another layer or substrate, it can be directly on the other layer or substrate or intervening layers may also be present. In contrast, when a layer is referred to as being "directly on" or extending "directly onto" another layer or substrate (and/or variations thereof), there are no intervening layers present. Like numbers refer to like elements throughout.

It will be understood that, although the terms first, second, A, B, etc. may be used herein in reference to elements of the inventive concepts, such elements should not be construed as limited by these terms. For example, a first element could be termed a second element, and a second element could be termed a first element, without departing from the scope of the inventive concepts.

Spatially relative terms, such as "top end," "bottom end," "top surface," "bottom surface," "upper portion," and "lower portion" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein to describe embodiments of the inventive concepts is not intended to limit the scope of the inventive concepts. The articles "a," "an," and "the" are singular in that they have a single referent, however the use of the singular form in the present document should not preclude the presence of more than one referent. In other words, elements of the inventive concepts referred to in the singular may number one or more, unless the context clearly indicates otherwise. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Unless otherwise defined, all terms (including technical and scientific terms) used herein are to be interpreted as is customary in the art to which these inventive concepts belong. It will be further understood that terms in common usage should also be interpreted as is customary in the relevant art and not in an idealized or overly formal sense unless expressly so defined herein.

FIGS. 1A through 2K are cross-sectional views and layouts of a semiconductor package according to embodiments of the inventive concepts, and FIGS. 3 through 7 are enlarged views of a portion of the semiconductor package shown in FIG. 1.

Referring to FIG. 1A, a first semiconductor chip 21 may be mounted on a substrate 11. A second semiconductor chip 31 may be mounted on the first semiconductor chip 21.

The substrate 11 may include a plurality of external electrodes 13, a plurality of substrate lines 15, and a plurality of internal electrodes 17. The first semiconductor chip 21 may include a first active layer 22, a first rear surface layer 23, a plurality of first through-silicon vias (TSVs) 25, a plurality of first lower electrodes 26, and a plurality of first upper electrodes 27. A plurality of first connection terminals 19 may be formed between the internal electrodes 17 of the substrate 11 and the first lower electrodes 26 of the first semiconductor chip 21. An under-fill material 20 may be formed between the substrate 11 and the first semiconductor chip 21. In other embodiments, the under-fill material 20 may be omitted.

The second semiconductor chip 31 may include a second active layer 32 and a plurality of second lower electrodes 36. Second connection terminals 38 may be formed on the second lower electrodes 36. A first adhesive layer 39 may be formed between the second active layer 32 and the first rear surface layer 23. The first adhesive layer 39 may be in contact with the second active layer 32 and the first rear surface layer 23. The first upper electrodes 27, the second connection terminals 38, and the second lower electrodes 36 may be disposed through the first adhesive layer 39. The second connection terminals 38 may be formed between the second lower electrodes 36 and the first upper electrodes 27. The second connection terminals 38 may penetrate the first adhesive layer 39 in contact with the second lower electrodes 36 and the first upper electrodes 27.

The second semiconductor chip 31 may have a greater horizontal width than the first semiconductor chip 21. Side surfaces of the first adhesive layer 39 may be vertically aligned with side surfaces of the second semiconductor chip 31. The first adhesive layer 39 may have a greater horizontal width than the first semiconductor chip 21. The second semiconductor chip 31 may have a greater vertical thickness than the first semiconductor chip 21. In other embodiments, the first adhesive layer 39 may partially cover the side surfaces of the first semiconductor chip 21.

An encapsulant 97 may be formed on the substrate 11 to cover the first and second semiconductor chips 21 and 31. When the under-fill material 20 is omitted, the encapsulant 97 may be formed between the substrate 11 and the first semiconductor chip 21. In other embodiments, a top surface of the second semiconductor chip 31 may be exposed. External terminals 12 may be formed on the external electrodes 13. Each of the external terminals 12 may include a solder ball, a conductive bump, a conductive paste, a lead grid array (LGA), a pin grid array (PGA), or a combination thereof. The second semiconductor chip 31 may be electrically connected to the external terminals 12 via the second lower electrodes 36, the second connection terminals 38, the first upper electrodes 27, the first TSVs 25, the first lower electrodes 26, the first connection terminals 19, the internal electrodes 17, the substrate lines 15, and the external electrodes 13.

In other embodiments, the external terminals 12 may be omitted.

The first semiconductor chip 21 may be a logic chip, such as a microprocessor (MP), a controller, an application processor (AP), or a combination thereof. The second semiconductor chip 31 may be a memory chip, such as a volatile memory or a non-volatile memory.

Accordingly, FIG. 1A also illustrates a semiconductor package according to various embodiments of the inventive concepts including a substrate 11 and a first semiconductor chip 21 on the substrate and having a plurality of connective vias 25 extending therethrough. A second semiconductor chip 31 is on the first semiconductor chip 21 remote from the substrate 11. The second semiconductor chip 31 is wider than the first semiconductor chip 21. An adhesive layer 39 is on the second semiconductor chip 31 and extends on the second semiconductor chip 31 beyond the first semiconductor chip 21. A plurality of electrodes 36 are provided in the adhesive layer 39 that electrically connect the second semiconductor chip 31 to the plurality of conductive vias 25 that extend through the first semiconductor chip 21. Moreover, in some embodiments, the adhesive layer 39 extends on the second semiconductor chip 31, to align with a side of the second semiconductor chip 31. Moreover, in some embodiments, the electrodes 36 are first electrodes, and the semiconductor package further comprises a plurality of second electrodes 27 on the first semiconductor chip 21 adjacent the second semiconductor chip 31, a respective one of which is connected to a respective one of the conductive vias 25 and a respective one of the first electrodes 36.

Figure 1B:
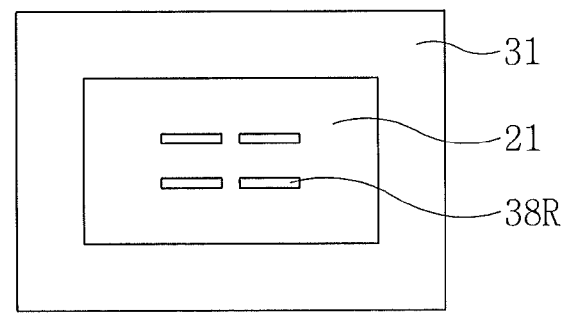
Figure 1C:
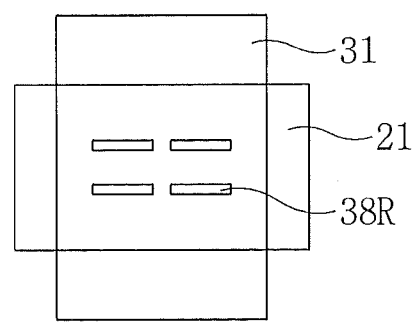

Referring to FIGS. 1B and 1C, the first semiconductor chip 21 and the second semiconductor chip 31 may have various horizontal widths. The second connection terminals 38 may be formed in bump regions 38R between the first semiconductor chip 21 and the second semiconductor chip 31.

Figure 2A:
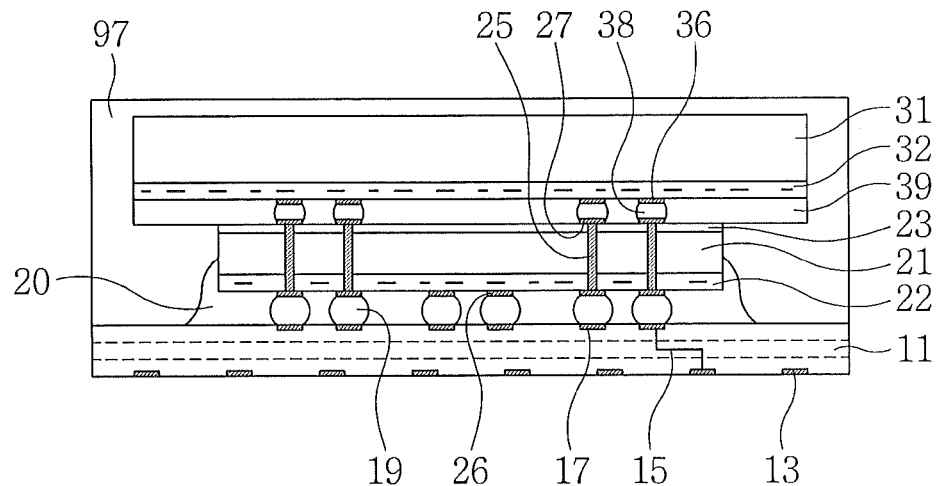

Referring to FIG. 2A, the external electrodes 13 may be exposed under the substrate 11. The second semiconductor chip 31 may be electrically connected to the substrate 11 and the first semiconductor chip 21 via the second lower electrodes 36, the second connection terminals 38, the first upper electrodes 27, the first TSVs 25, the first lower electrodes 26, and the first connection terminals 19.

In other embodiments, the external electrodes 13 may be omitted.

Figure 2B:
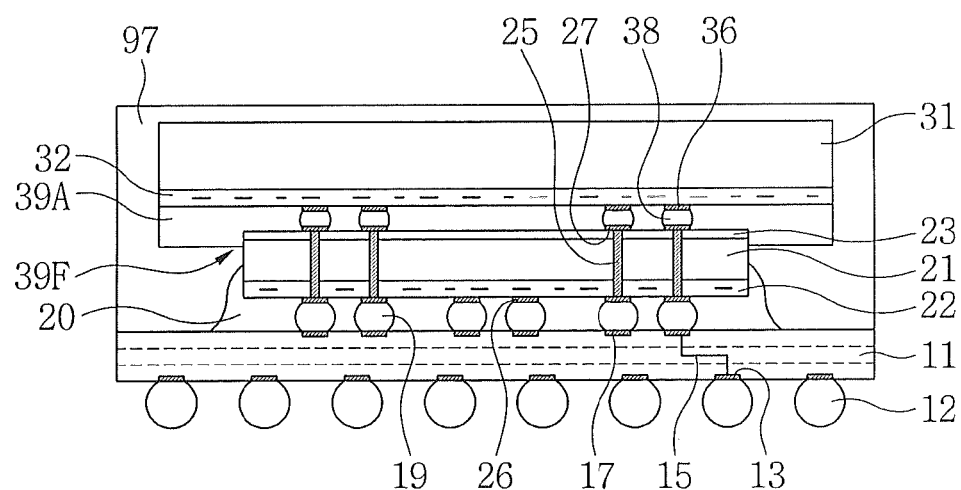
Figure 2C:
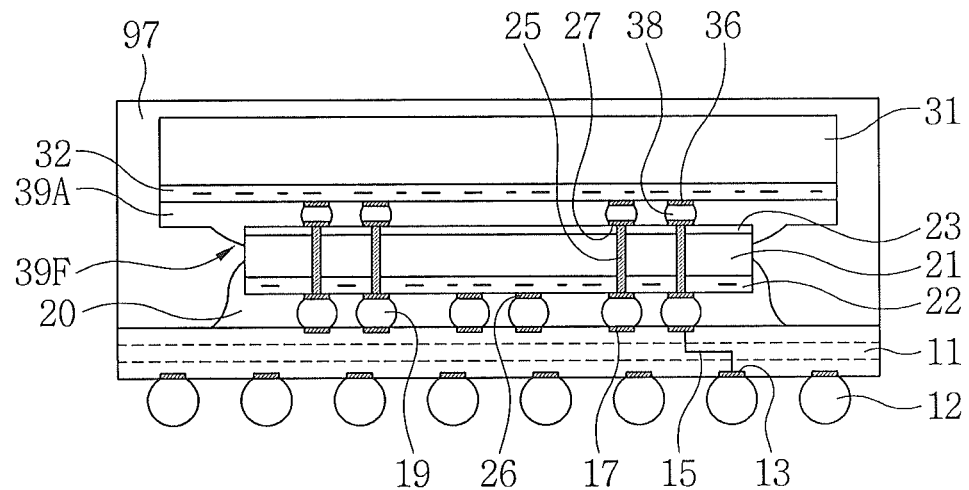

Referring to FIGS. 2B and 2C, a first adhesive layer 39A may include a fillet 39F partially covering the side surfaces of the first semiconductor chip 21. The fillet 39F may have various shapes.

Figure 2D:
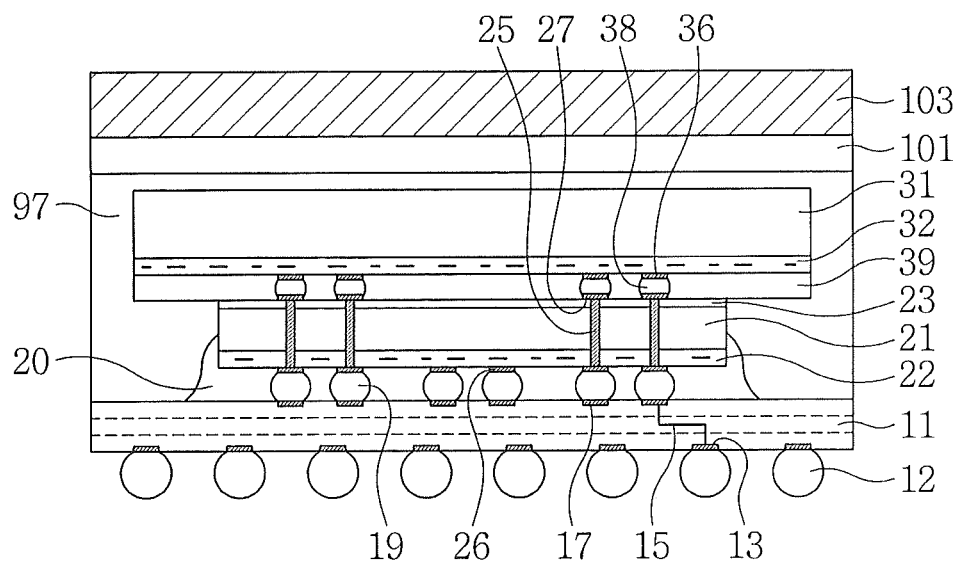

Referring to FIG. 2D, a thermal interface material (TIM) layer 101 may be formed on the encapsulant 97. A heat slug 103 may be formed on the TIM layer 101.

Figure 2E:
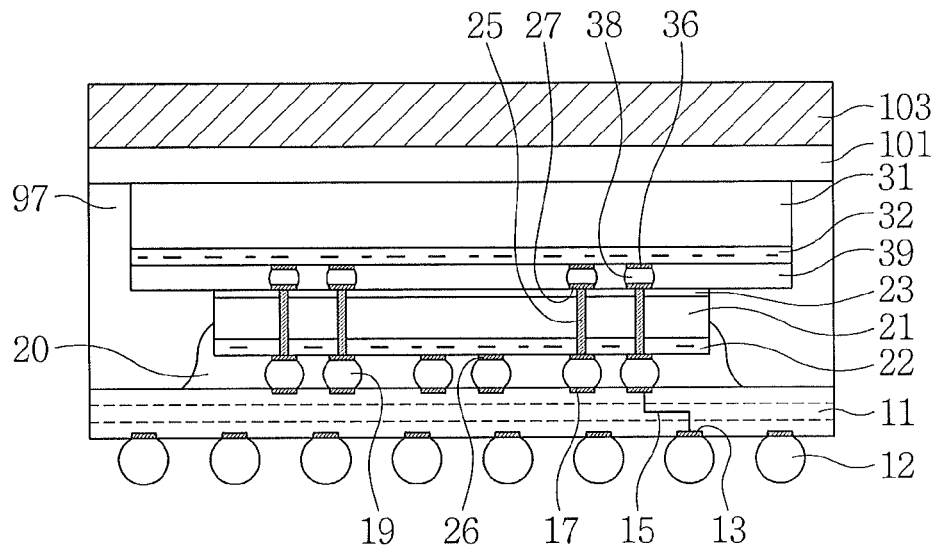

Referring to FIG. 2E, top ends of an encapsulant 97 and a second semiconductor chip 31 may be formed on substantially the same plane surface. A TIM layer 101 may be formed on the encapsulant 97 and the second semiconductor chip 31. A heat slug 103 may be formed on the TIM layer 101. The TIM layer 101 may be in direct contact with the second semiconductor chip 31 and the heat slug 103.

Figure 2F:
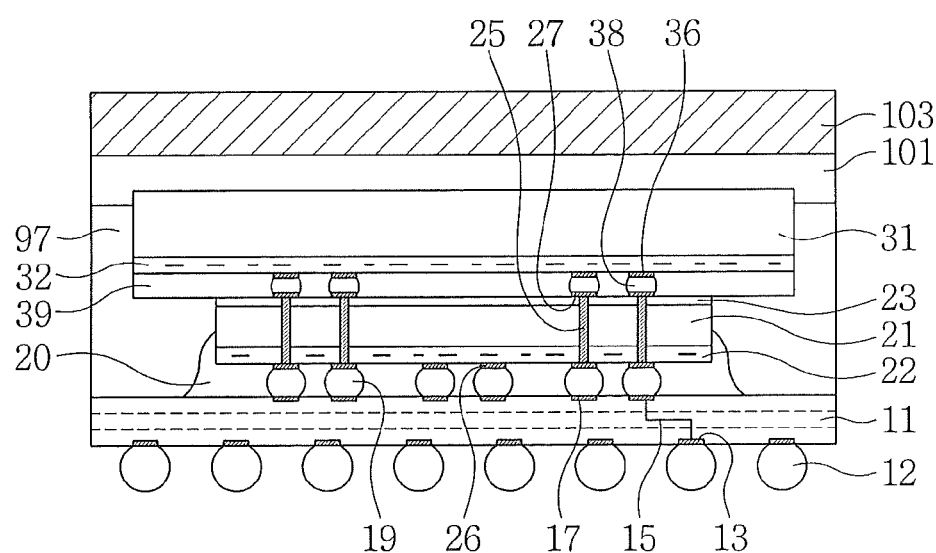

Referring to FIG. 2F, an encapsulant 97 may be disposed at a lower level than top ends of a second semiconductor chip 31. A TIM layer 101 may be formed on the encapsulant 97 and the second semiconductor chip 31. A heat slug 103 may be formed on the TIM layer 101. The TIM layer 101 may be in contact with a top surface and side surfaces of the second semiconductor chip 31.

Figure 2G:
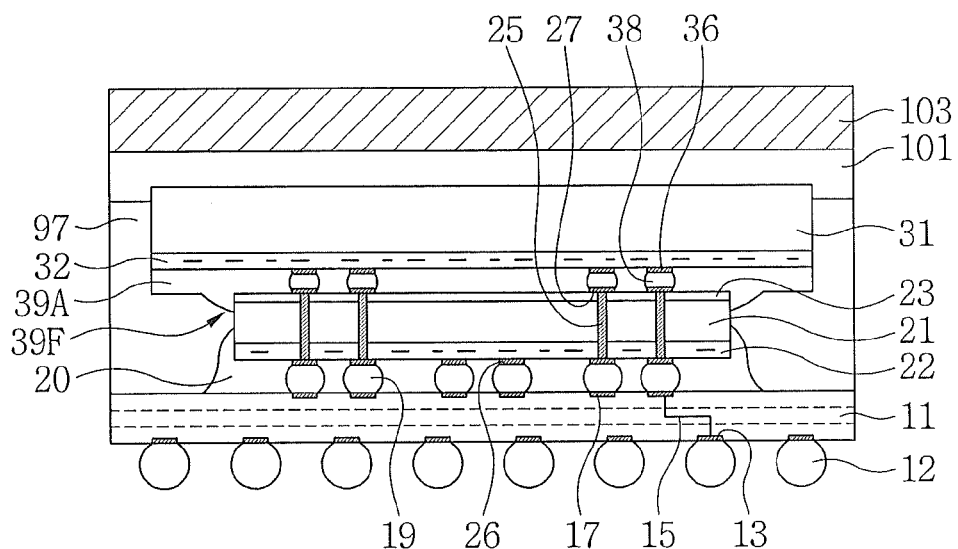

Referring to FIG. 2G, the TIM layer 101 may be in contact with the top surface and side surfaces of the second semiconductor chip 31. The first adhesive layer 39A may include the fillet 39F partially covering the side surfaces of the first semiconductor chip 21.

Figure 2H:
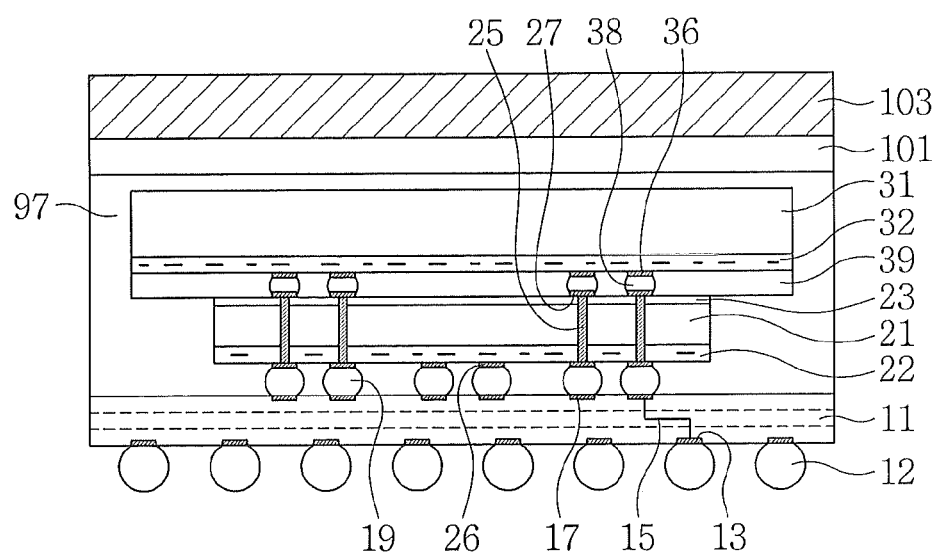

Referring to FIG. 2H, an encapsulant 97 may fill space between the substrate 11 and the first semiconductor chip 21. First connection terminals 19 may penetrate the encapsulant 97 and be connected to the internal electrodes 17 of the substrate 11 and the first lower electrodes 26 of the first semiconductor chip 21. A TIM layer 101 and a heat slug 103 may be sequentially formed on the encapsulant 97.

Figure 2I:
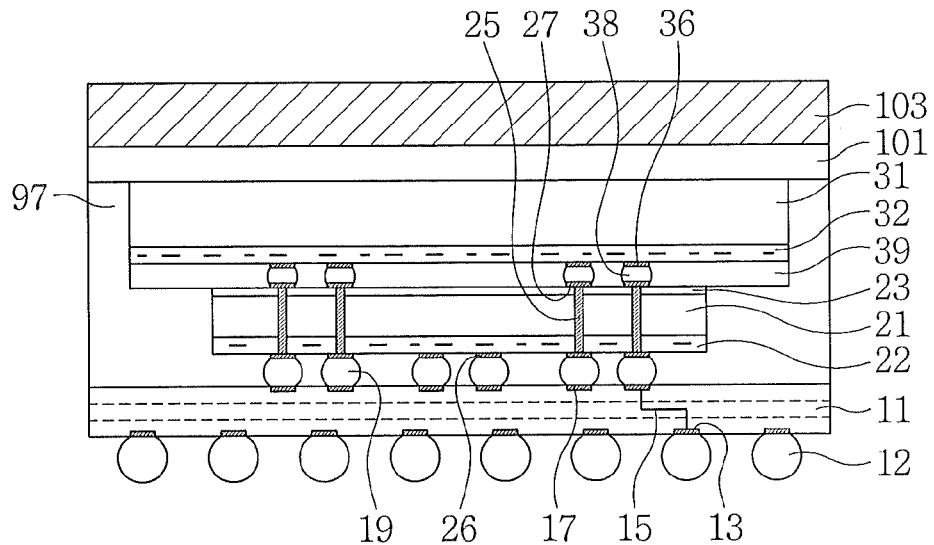

Referring to FIG. 2I, an encapsulant 97 may fill space between the substrate 11 and the first semiconductor chip 21. Top ends of the encapsulant 97 and the second semiconductor chip 31 may be formed on substantially the same plane surface. The TIM layer 101 and the heat slug 103 may be sequentially formed on the encapsulant 97 and the second semiconductor chip 31.

Figure 2J:
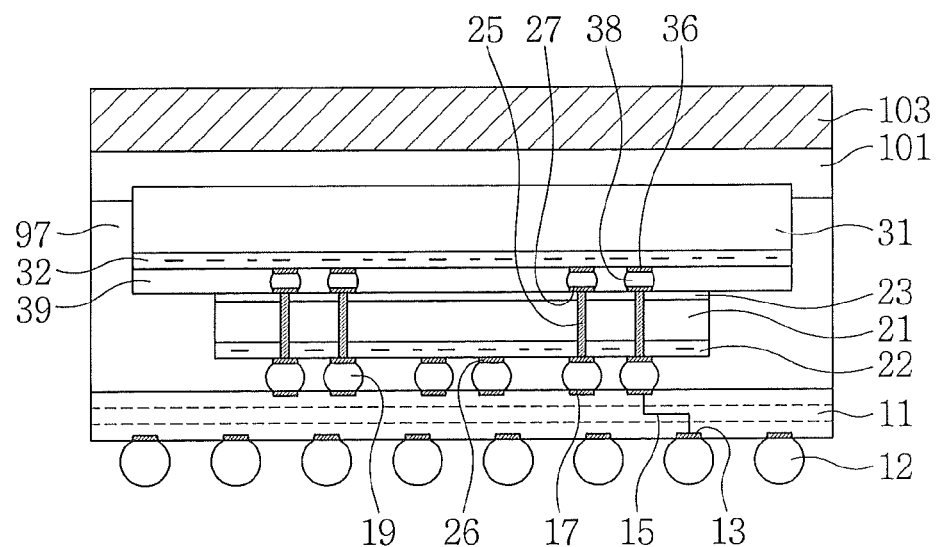

Referring to FIG. 2J, an encapsulant 97 may fill space between the substrate 11 and the first semiconductor chip 21. The encapsulant 97 may be formed at a lower level than top ends of a second semiconductor chip 31. A TIM layer 101 and a heat slug 103 may be sequentially formed on the encapsulant 97 and the second semiconductor chip 31. The TIM layer 101 may be in contact with the top surface and side surfaces of the second semiconductor chip 31.

Figure 2K:
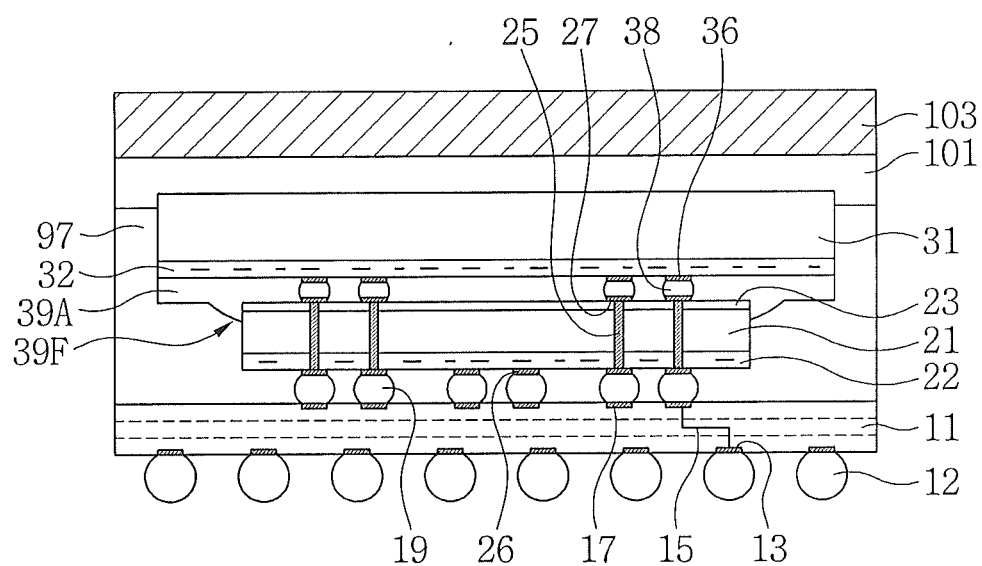

Referring to FIG. 2K, an encapsulant 97 may fill space between the substrate 11 and the first semiconductor chip 21. The TIM layer 101 may be in contact with the top surface and side surfaces of the second semiconductor chip 31. The first adhesive layer 39A may include a fillet 39F partially covering side surfaces of the first semiconductor chip 21.

Figure 3:
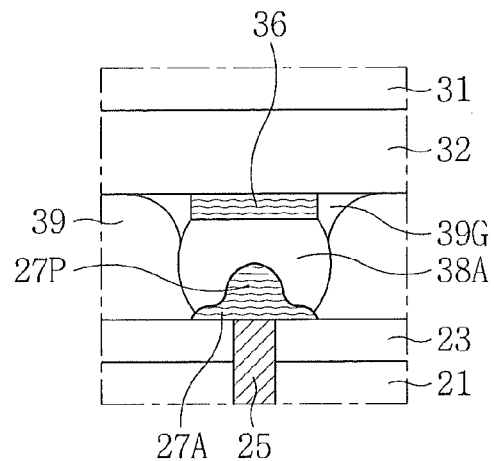
FIGS. 3 through 7 are enlarged views of a portion of the semiconductor package shown in FIG. 1.

Referring to FIG. 3, a first upper electrode 27A may be in contact with one end of the first TSV 25. The first upper electrode 27A may protrude upward from the first rear surface layer 23 of the first semiconductor layer 21. A top end of the first upper electrode 27A may protrude to a higher level than the first rear surface layer 23. The first upper electrode 27A may be referred to as a projection electrode. The top end of the first upper electrode 27A may have a smaller width than a bottom end thereof. The top end of the first upper electrode 27A may have a pointed pin shape. A second connection terminal 38A may be disposed on the first upper electrode 27A. A second lower electrode 36 may be disposed on the second connection terminal 38A. A second active layer 32 of the second semiconductor chip 31 may be disposed on the second lower electrode 36. The first adhesive layer 39 may be formed between the first rear surface layer 23 and the second active layer 32. The first upper electrode 27A, the second connection terminal 38A, and the second lower electrode 36 may penetrate the first adhesive layer 39.

The first upper electrode 27A may include copper (Cu), titanium (Ti), titanium nitride (TiN), tantalum (Ta), tantalum nitride (TaN), tungsten (W), tungsten nitride (WN), nickel (Ni), gold (Au), silver (Ag), platinum (Pt), ruthenium (Ru), or a combination or subcombination thereof. The second lower electrode 36 may include Cu, Ti, TiN, Ta, TaN, W, WN, Ni, Au, Ag, Pt, Ru, or a combination or subcombination thereof. For example, at least one of the first upper electrode 27A and the second lower electrode 36 may include Ta, Cu, Ni, and Au. The second connection terminal 38A may include a solder ball, a conductive bump, or a combination thereof.

The second connection terminal 38A may cover the top end and side surfaces of the first upper electrode 27A. The top end of the first upper electrode 27A may be formed at a higher level than a bottom end of the second connection terminal 38A. A bottom surface of the second lower electrode 36 may be in contact with the second connection terminal 38A. Pores 39G may be formed between the second active layer 32 and the first adhesive layer 39. The pores 39G may be formed near to the second lower electrode 36 and the second connection terminal 38A. Side surfaces of the second lower electrode 36 and side surfaces of the second connection terminal 38A may be partially exposed within the pores 39G.

In other embodiments, the pores 39G may be removed.

Figure 4:
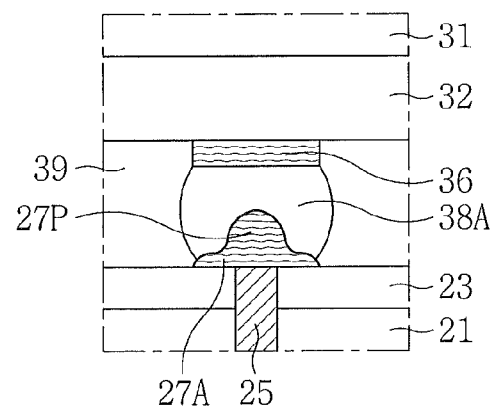

Referring to FIG. 4, a first upper electrode 27A, a second connection terminal 38A, and a second lower electrode 36 may be configured to penetrate a first adhesive layer 39. The first adhesive layer 39 may be closely adhered to side surfaces of the first upper electrode 27A, the second connection terminal 38A, and the second lower electrode 36.

Figure 5:
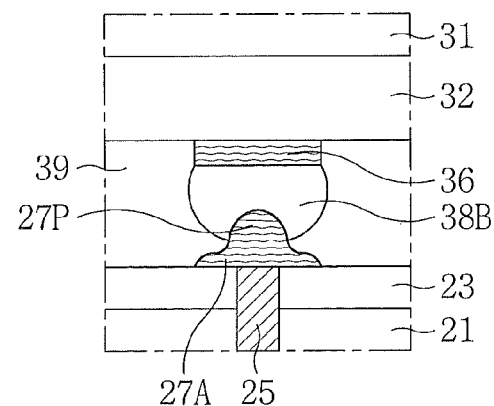

Referring to FIG. 5, a second connection terminal 38B may be in contact with a top end region of a first upper electrode 27A. A bottom end region of the first upper electrode 27A may be in contact with a first adhesive layer 39.

Moreover, embodiments of FIGS. 3, 4 and 5 also illustrate that the second electrodes 27A have nonplanar surfaces adjacent the respective first electrodes 36, and the respective first electrodes 36 have planar surfaces adjacent the respective second electrodes 27A. Moreover, FIGS. 3-5 also illustrate that the second electrodes 27A may comprise a base and a protrusion 27P extending from the base towards the respective first electrodes 36 wherein the protrusion 27P is narrower than the base. Finally FIGS. 3-5 also illustrate a plurality of solder bumps 38A, a respective one of which is between a respective one of the first electrodes 36 and a respective one of the second electrodes 27A.

Figure 6:
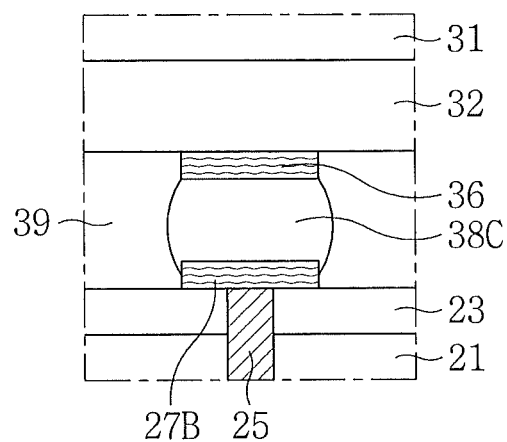

Referring to FIG. 6, a top end of a first upper electrode 27B may have substantially the same horizontal width as a bottom end thereof. A second connection terminal 38C may cover a top surface and side surface of the first upper electrode 27B. The second connection terminal 38C may be in contact with a bottom surface of a second lower electrode 36.

Figure 7:
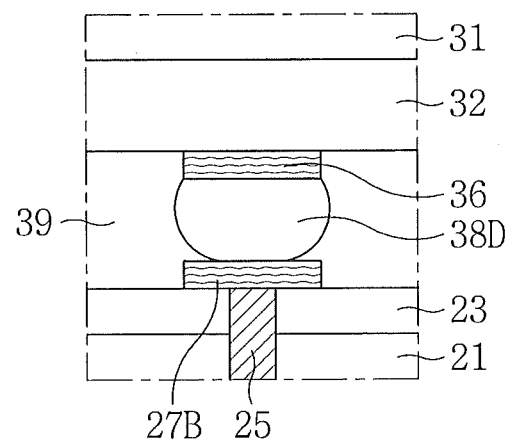

Referring to FIG. 7, a second connection terminal 38D may partially cover a top surface of a first upper electrode 27B. The top surface of the first upper electrode 27B may be in contact with the first adhesive layer 39 and the second connection terminal 38D.

Figure 8:
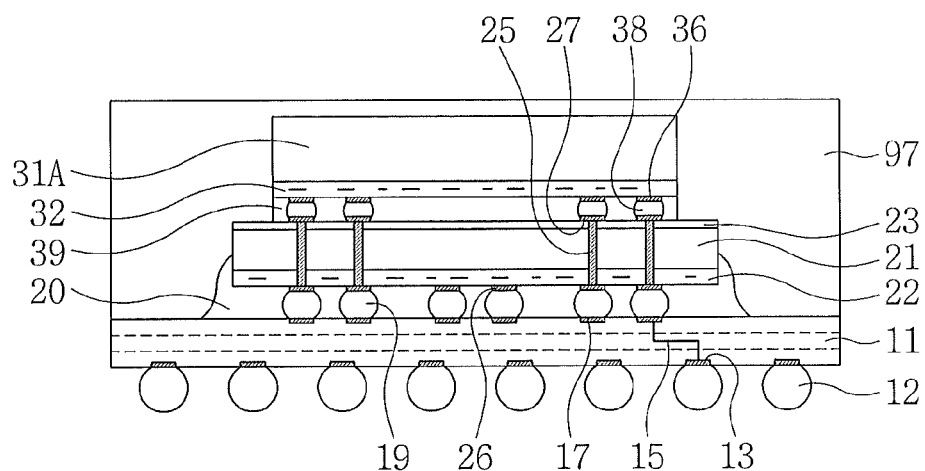
FIG. 8 is a cross-sectional view of a semiconductor package according to embodiments of the inventive concepts.

FIG. 8 is a cross-sectional view of a semiconductor package according to embodiments of the inventive concepts, and FIGS. 9 through 12 are enlarged views of a portion of the semiconductor package shown in FIG. 8.

Referring to FIG. 8, a second semiconductor chip 31A may have a smaller horizontal width than a first semiconductor chip 21.

Figure 9:
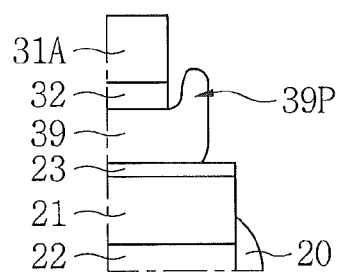
FIGS. 9 through 12 are enlarged views of a portion of the semiconductor package shown in FIG. 8.

Referring to FIG. 9, a first adhesive layer 39 may include a protrusion 39P. The protrusion 39P of the first adhesive layer 39 may protrude outside the second semiconductor chip 31A. The protrusion 39P of the first adhesive layer 39 may be formed over the first semiconductor chip 21 and protrude at a higher level than a top end of the second active layer 32. The protrusion 39P of the first adhesive layer 39 may be spaced apart from side surfaces of the second semiconductor chip 31A. The side surfaces of the second semiconductor chip 31A may be configured not to contact the protrusion 39P of the first adhesive layer 39.

Figure 10:
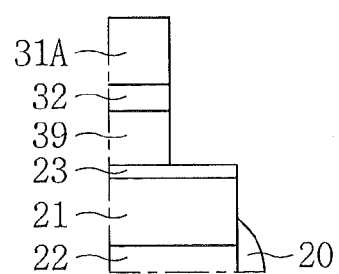

Referring to FIG. 10, side surfaces of a first adhesive layer 39, a second active layer 32, and a second semiconductor chip 31A may be vertically aligned with one another.

Figure 11:
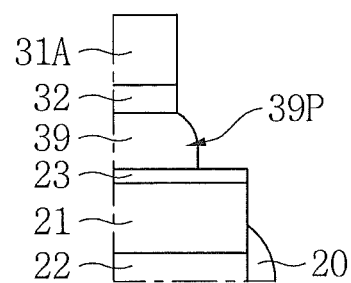

Referring to FIG. 11, a first adhesive layer 39 may include a protrusion 39P. The protrusion 39P of the first adhesive layer 39 may protrude outside a second semiconductor chip 31A. The protrusion 39P of the first adhesive layer 39 may be formed on a first rear surface layer 23 and protrude at a lower level than a bottom end of a second active layer 32.

Figure 12:
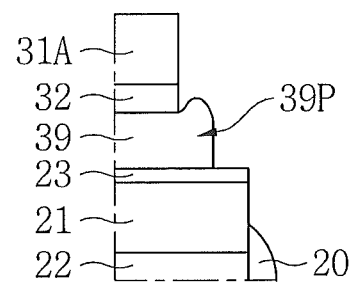

Referring to FIG. 12, a protrusion 39P of a first adhesive layer 39 may protrude at a higher level than a bottom end of a second active layer 32.

Figure 13:
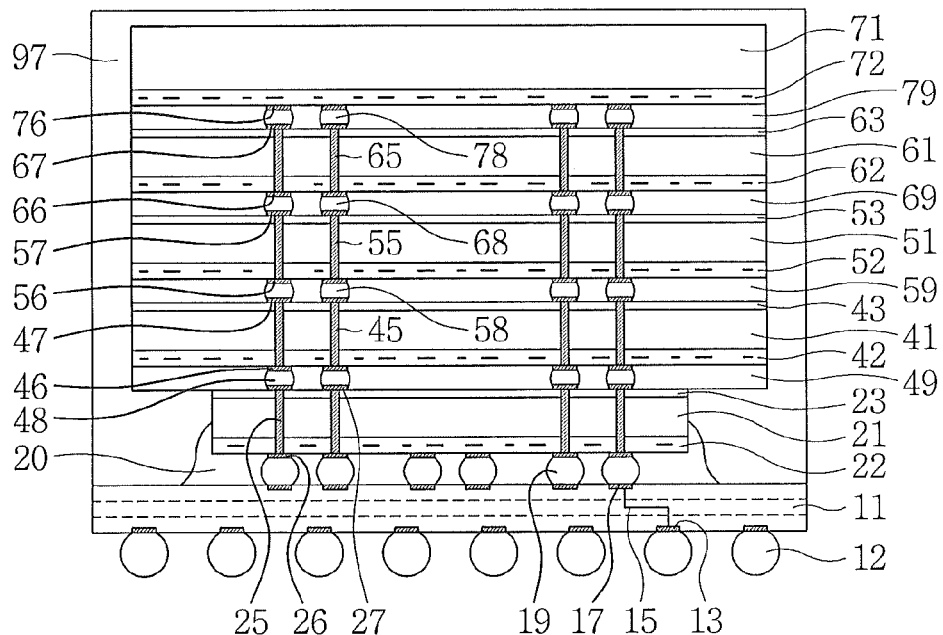
FIGS. 13 through 15 are cross-sectional views of a semiconductor package according to embodiments of the inventive concepts.
Figure 14:
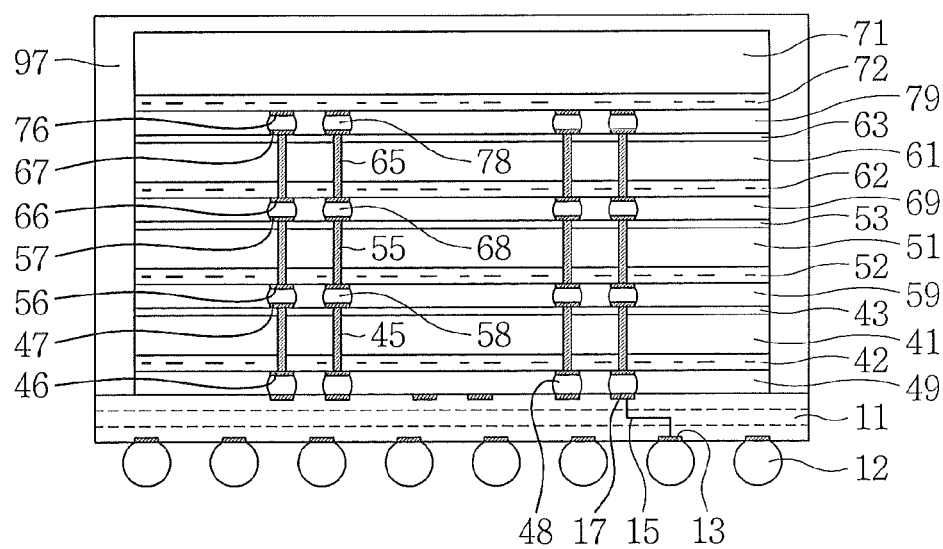
Figure 15:
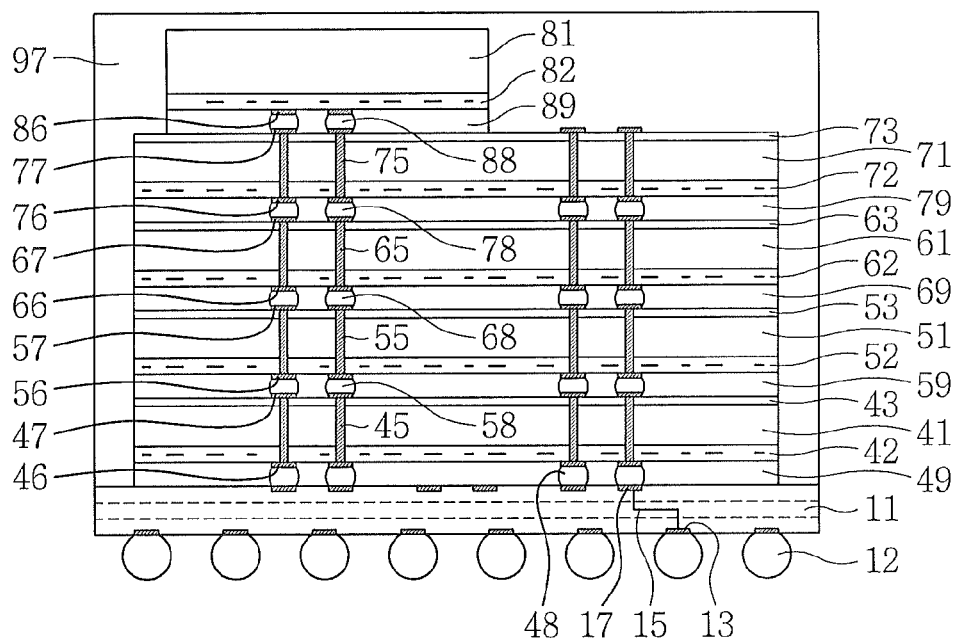

FIGS. 13 through 15 are cross-sectional views of a semiconductor package according to embodiments of the inventive concepts.

Referring to FIG. 13, a first semiconductor chip 21 may be mounted on a substrate 11. Third through sixth semiconductor chips 41, 51, 61, and 71 may be sequentially mounted on the first semiconductor chip 21. Each of the third through sixth semiconductor chips 41, 51, 61, and 71 may be a memory chip, such as a volatile memory or a non-volatile memory.

The substrate 11 may include a plurality of external electrodes 13, a plurality of substrate lines 15, and a plurality of internal electrodes 17. The first semiconductor chip 21 may include a first active layer 22, a first rear surface layer 23, a plurality of first TSVs 25, a plurality of first lower electrodes 26, and a plurality of first upper electrodes 27. A plurality of first connection terminals 19 may be formed between the internal electrodes 17 of the substrate 11 and the first lower electrodes 26 of the first semiconductor chip 21. An under-fill material 20 may be formed between the substrate 11 and the first semiconductor chip 21.

The third semiconductor chip 41 may include a third active layer 42, a third rear surface layer 43, a plurality of third TSVs 45, a plurality of third lower electrodes 46, and a plurality of third upper electrodes 47. Third connection terminals 48 may be formed on the third lower electrodes 46. A third adhesive layer 49 may be formed between the third active layer 42 and the first rear surface layer 23. The third adhesive layer 49 may be in contact with the third active layer 42 and the first rear surface layer 23. The first upper electrodes 27, the third connection terminals 48, and the third lower electrodes 46 may penetrate the third adhesive layer 49. The third connection terminals 48 may be formed between the third lower electrodes 46 and the first upper electrodes 27. The third connection terminals 48 may be formed through the third adhesive layer 49 and in contact with the third lower electrodes 46 and the first upper electrodes 27.

The fourth semiconductor chip 51 may include a fourth active layer 52, a fourth rear surface layer 53, a plurality of fourth TSVs 55, a plurality of fourth lower electrodes 56, and a plurality of fourth upper electrodes 57. Fourth connection terminals 58 may be formed on the fourth lower electrodes 56. A fourth adhesive layer 59 may be formed between the fourth active layer 52 and the third rear surface layer 43. The fourth adhesive layer 59 may be in contact with the fourth active layer 52 and the third rear surface layer 43. The third upper electrodes 47, the fourth connection terminals 58, and the fourth lower electrodes 56 may penetrate the fourth adhesive layer 59. The fourth connection terminals 58 may be formed between the fourth lower electrodes 56 and the third upper electrodes 47. The fourth connection terminals 58 may be formed through the fourth adhesive layer 59 and in contact with the fourth lower electrodes 56 and the third upper electrodes 47.

The fourth semiconductor chip 61 may include a fifth active layer 62, a fifth rear surface layer 63, a plurality of fifth TSVs 65, a plurality of fifth lower electrodes 66, and a plurality of fifth upper electrodes 67. Fifth connection terminals 68 may be formed on the fifth lower electrodes 66. A fifth adhesive layer 69 may be formed between the fifth active layer 62 and the fourth rear surface layer 53. The fifth adhesive layer 69 may be in contact with the fifth active layer 62 and the fourth rear surface layer 53. The fourth upper electrodes 57, the fifth connection terminals 68, and the fifth lower electrodes 66 may penetrate the fifth adhesive layer 69. The fifth connection terminals 68 may be formed between the fifth lower electrodes 66 and the fourth upper electrodes 57. The fifth connection terminals 68 may be formed through the fifth adhesive layer 69 and in contact with the fifth lower electrodes 66 and the fourth upper electrodes 57.

The sixth semiconductor chip 71 may include a sixth active layer 72 and a plurality of sixth lower electrodes 76. Sixth connection terminals 78 may be formed on the sixth lower electrodes 76. A sixth adhesive layer 79 may be formed between the sixth active layer 72 and the fifth rear surface layer 63. The sixth adhesive layer 79 may be in contact with the sixth active layer 72 and the fifth rear surface layer 63. The fifth upper electrodes 67, the sixth connection terminals 78, and the sixth lower electrodes 76 may penetrate the sixth adhesive layer 79. The sixth connection terminals 78 may be formed between the sixth lower electrodes 76 and the fifth upper electrodes 67. The sixth connection terminals 78 may be formed through the sixth adhesive layer 79 and in contact with the sixth lower electrodes 76 and the fifth upper electrodes 67.

The third semiconductor chip 41 may have a greater horizontal width than the first semiconductor chip 21. The fourth through sixth semiconductor chips 51, 61, and 71 may have substantially the same horizontal width as the third semiconductor chip 41. Side surfaces of the third through sixth adhesive layers 49, 59, 69, and 79 may be vertically aligned with side surfaces of the third through sixth semiconductor chips 41, 51, 61, and 71. An encapsulant 97 may be formed on the substrate 11 to cover the first semiconductor chip 21 and the third through sixth semiconductor chips 41, 51, 61, and 71. External terminals 12 may be formed on the external electrodes 13.

Referring to FIG. 14, third through sixth semiconductor chips 41, 51, 61, and 71 may be mounted on a substrate 11. Each of the third through sixth semiconductor chips 41, 51, 61, and 71 may be a memory chip, such as a volatile memory or a non-volatile memory.

The substrate 11 may include a plurality of external electrodes 13, a plurality of substrate lines 15, and a plurality of internal electrodes 17. The third semiconductor chip 41 may include a third active layer 42, a third rear surface layer 43, a plurality of third TSVs 45, a plurality of third lower electrodes 46, and a plurality of third upper electrodes 47. Third connection terminals 48 may be formed on the third lower electrodes 46. A third adhesive layer 49 may be formed between the third active layer 42 and the substrate 11. The third adhesive layer 49 may be in contact with the third active layer 42 and the substrate 11. The third connection terminals 48 and the third lower electrodes 46 may penetrate the third adhesive layer 49. The third connection terminals 48 may be formed between the third lower electrodes 46 and the internal electrodes 17. The third connection terminals 48 may be formed through the third adhesive layer 49 and in contact with the third lower electrodes 46 and the internal electrodes 17.

Referring to FIG. 15, third through sixth semiconductor chips 41, 51, 61, and 71 may be sequentially mounted on a substrate 11. A seventh semiconductor chip 81 may be mounted on the sixth semiconductor chip 71. Each of the third through sixth semiconductor chips 41, 51, 61, and 71 may be a memory chip, such as a volatile memory or a non-volatile memory. The seventh semiconductor chip 81 may be a logic chip, such as an MP, a controller, an AP, or a combination thereof.

The sixth semiconductor chip 71 may include a sixth active layer 72, a sixth rear surface layer 73, a plurality of sixth TSVs 75, a plurality of sixth lower electrodes 76, and a plurality of sixth upper electrodes 77. Sixth connection terminals 78 may be formed on the sixth lower electrodes 76. A sixth adhesive layer 79 may be formed between the sixth active layer 72 and the fifth rear surface layer 63. The sixth adhesive layer 79 may be in contact with the sixth active layer 72 and the fifth rear surface layer 63. The fifth upper electrodes 67, the sixth connection terminals 78, and the sixth lower electrodes 76 may penetrate the sixth adhesive layer 79. The sixth connection terminals 78 may be formed between the sixth lower electrodes 76 and the fifth upper electrodes 67. The sixth connection terminals 78 may penetrate the sixth adhesive layer 79 and be in contact with the sixth lower electrodes 76 and the fifth upper electrodes 67.

The seventh semiconductor chip 81 may include a seventh active layer 82 and a plurality of seventh lower electrodes 86. Seventh connection terminals 88 may be formed on the seventh lower electrodes 86. A seventh adhesive layer 89 may be formed between the seventh active layer 82 and the sixth rear surface layer 73. The seventh adhesive layer 89 may be in contact with the seventh active layer 82 and the sixth rear surface layer 73. The sixth upper electrodes 77, the seventh connection terminals 88, and the seventh lower electrodes 86 may penetrate the seventh adhesive layer 89. The seventh connection terminals 88 may be formed between the seventh lower electrodes 86 and the sixth upper electrodes 77. The seventh connection terminals 88 may be formed through the seventh adhesive layer 89 and in contact with the seventh lower electrodes 86 and the sixth upper electrodes 77.

The seventh semiconductor chip 81 may have a smaller horizontal width than the sixth semiconductor chip 71. Side surfaces of the seventh adhesive layer 89 may be vertically aligned with side surfaces of the seventh semiconductor chip 81.

FIGS. 16 through 22 are cross-sectional views illustrating methods of forming semiconductor packages according to embodiments of the inventive concepts.

Figure 16:
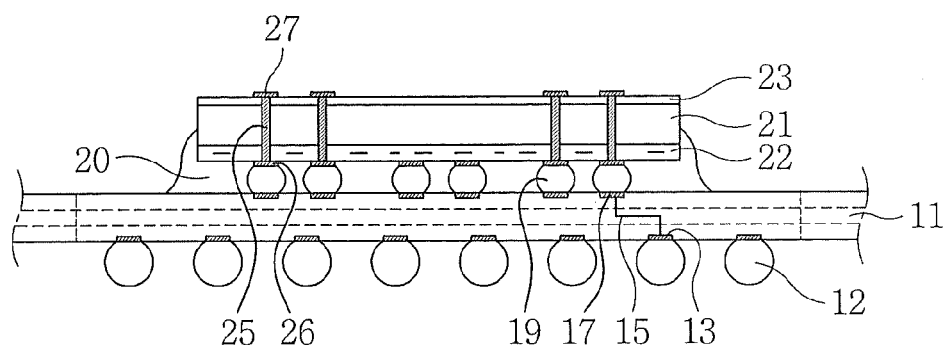
FIGS. 16 through 22 are cross-sectional views illustrating methods of forming semiconductor packages according to embodiments of the inventive concepts.

Referring to FIG. 16, a first semiconductor chip 21 may be mounted on a substrate 11. The substrate 11 may include a plurality of external electrodes 13, a plurality of substrate lines 15, and a plurality of internal electrodes 17. The first semiconductor chip 21 may include a first active layer 22, a first rear surface layer 23, a plurality of first TSVs 25, a plurality of first lower electrodes 26, and a plurality of first upper electrodes 27. A plurality of first connection terminals 19 may be formed between the internal electrodes 17 of the substrate 11 and the first lower electrodes 26 of the first semiconductor chip 21. An under-fill material 20 may be formed between the substrate 11 and the first semiconductor chip 21.

The substrate 11 may include a rigid printed circuit board (PCB), a flexible PCB, or a combination thereof. The substrate 11 may be referred to as a package substrate. The external electrodes 13 may be exposed on a bottom surface of the substrate 11. The internal electrodes 17 may be formed on a top surface of the substrate 11. The internal electrodes 17 may be connected to the external electrodes 13 via the substrate lines 15. The internal electrodes 17 may be referred to as finger electrodes or substrate pads. Each of the external electrodes 13, the substrate lines 15, and the internal electrodes 17 may include Cu, Ti, TiN, Ta, TaN, W, WN, Ni, Au, Ag, Pt, Ru, or a combination or subcombination thereof.

The first semiconductor chip 21 may be a logic chip, such as an MP, a controller, an AP, or a combination or subcombination thereof. The first active layer 22 formed on one surface of the first semiconductor chip 21 may include various kinds of active elements and passive elements, a redistribution layer, and insulating layers. The first rear surface layer 23 formed on another one surface of the first semiconductor chip 21 may include at least one insulating layer. Each of the first TSVs 25 may penetrate the first semiconductor chip 21. The first lower electrodes 26 may be formed on the first active layer 22. Some of the first lower electrodes 26 may be connected to the first TSVs 25. Some others of the first lower electrodes 26 may be connected to the active elements or passive elements disposed in the first active layer 22. The first upper electrodes 27 may be formed on the first rear surface layer 23 and connected to the first TSVs 25. Top ends of the first upper electrodes 27 may protrude at a higher level than the first rear surface layer 23. Each of the first upper electrodes 27 may be referred to as a projection electrode. Each of the first TSVs 25, the first lower electrodes 26, and the first upper electrodes 27 may include Cu, Ti, TiN, Ta, TaN, W, WN, Ni, Au, Ag, Pt, Ru, or a combination or subcombination thereof. Although side surfaces of the first TSVs 25 may be surrounded with an insulating structure, such as insulating spacers, a description thereof is omitted for brevity.

The first connection terminals 19 may include a solder ball, a conductive bump, a conductive paste, or a combination or subcombination thereof. The first rear surface layer 23 may include a redistribution layer. The under-fill material 20 may completely fill space between the substrate 11 and the first semiconductor chip 21, and partially cover side surfaces of the first semiconductor chip 21. The under-fill material 20 may be in contact with a top surface and side surfaces of the first active layer 22.

In other embodiments, the first lower electrodes 26 may be formed in the first active layer 22. One or all of the first lower electrodes 26 and the first upper electrodes 27 may be omitted.

Figure 17:
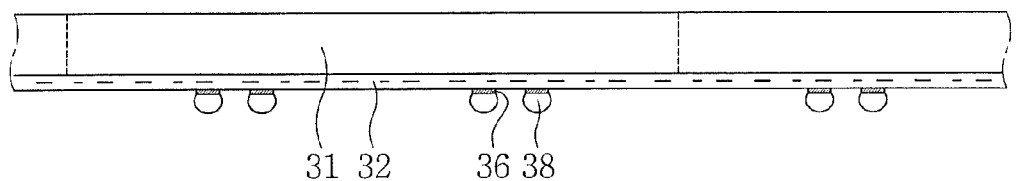

Referring to FIG. 17, a semiconductor wafer including a plurality of second semiconductor chips 31 may be provided. The second semiconductor chips 31 may include a second active layer 32 and a plurality of second lower electrodes 36. The second active layer 32 formed on one surfaces of the second semiconductor chips 31 may include various kinds of active elements and passive elements, a redistribution layer, and insulating layers. The second lower electrodes 36 may be formed on the second active layer 32. The second lower electrodes 36 may be connected to the active elements and the passive elements included in the second active layer 32. Second connection terminals 38 may be formed on the second lower electrodes 36.

Each of the second lower electrodes 36 may include Cu, Ti, TiN, Ta, TaN, W, WN, Ni, Au, Ag, Pt, Ru, or a combination or subcombination thereof. Each of the second connection terminals 38 may include a solder ball, a conductive bump, a conductive paste, or a combination or subcombination thereof. Each of the second semiconductor chips 31 may be of a different kind from the first semiconductor chip 21. Each of the second semiconductor chips 31 may be a memory chip, such as a volatile memory or a non-volatile memory. For example, each of the second semiconductor chips 31 may include a mobile dynamic random access memory (DRAM). Each of the second semiconductor chips 31 may have a different horizontal width and/or vertical thickness from the first semiconductor chip 21.

Figure 18:
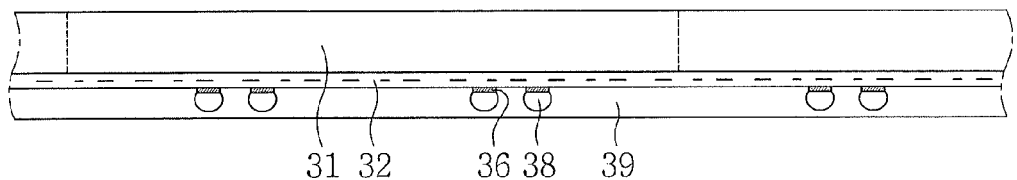

Referring to FIG. 18, a first adhesive layer 39 may be formed on the second active layer 32. The first adhesive layer 39 may cover the second lower electrodes 36 and the second connection terminals 38. The second lower electrodes 36 and the second connection terminals 38 may penetrate the first adhesive layer 39. The first adhesive layer 39 may include a tape-type material layer, a liquid-phase coating cure material layer, or a combination or subcombination thereof. The first adhesive layer 39 may include a thermal setting structure, a thermal plastic, an ultraviolet (UV) cure material, or a combination thereof. The first adhesive layer 39 may include an epoxy-type curing agent, a silicone-type curing agent, a phenol-type curing agent, an acid anhydride-type curing agent, an amine-type curing agent, acrylic polymer, or a combination or subcombination thereof. The first adhesive layer 39 may be referred to as a die-attach film (DAF) or a non-conductive film (NCF). The first adhesive layer 39 may have a planar surface.

Figure 19:
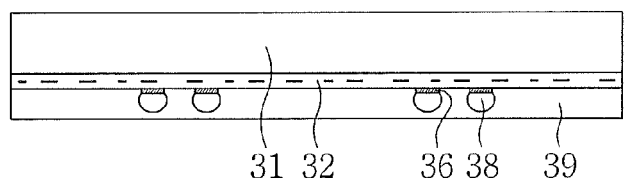

Referring to FIG. 19, the second semiconductor chips 31 may be separated from one another using a sawing process. Before the sawing process is performed or before forming the first adhesive layer 39, a back-grinding process may be performed to reduce the thickness of the second semiconductor chips 31. Side surfaces of the first adhesive layer 39 may be vertically aligned with side surfaces of the second semiconductor chips 31.

Figure 20:
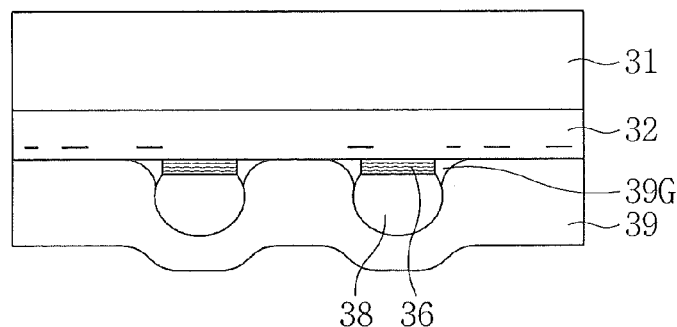

Referring to FIG. 20, pores 39G may be formed between the second active layer 32 and the first adhesive layer 39. The pores 39G may be formed near the second lower electrodes 36 and the second connection terminals 38. Side surfaces of the second lower electrodes 36 and side surfaces of the second connection terminals 38 may be partially exposed within the pores 39G. The first adhesive layer 39 may have a rugged (nonplanar) surface.

Figure 21:
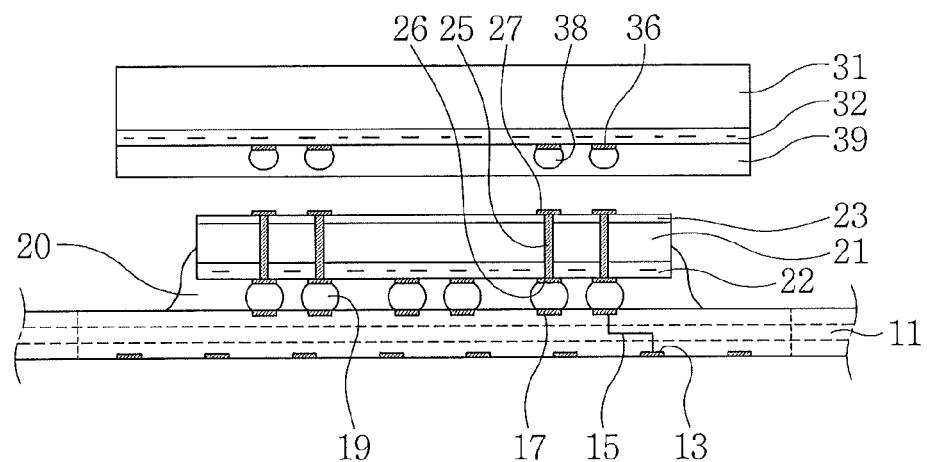

Referring to FIG. 21, one selected out of the second semiconductor chips 31 may be mounted on the first semiconductor chip 21. The mounting of the second semiconductor chip 31 on the first semiconductor chip 21 may be performed using a thermo-compression process. During this thermo-compression process, the first upper electrodes 27 may be brought into electrical contact with the second connection terminals 38.

Figure 22:
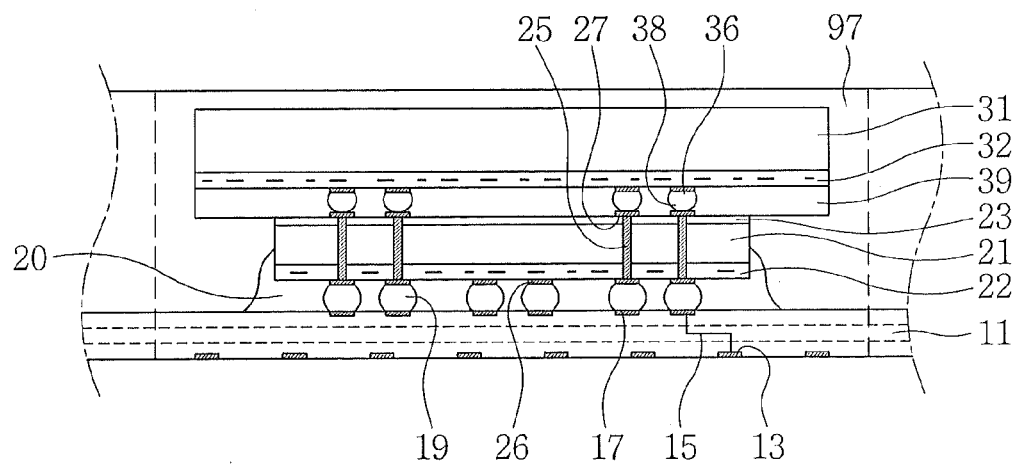

Referring to FIG. 22, an encapsulant 97 may be formed on the substrate 11 to cover the first semiconductor chip 21 and the second semiconductor chip 31. The encapsulant 97 may include a molding compound. The encapsulant 97 and the substrate 11 may be cut to appropriate sizes using a sawing process.

The second semiconductor chip 31 may have a greater horizontal width than the first semiconductor chip 21. The first adhesive layer 39 may be adhered onto the first rear surface layer 23. The first upper electrodes 27 may penetrate the first adhesive layer 39. The second connection terminals 38 may be in contact with the first upper electrodes 27. The second semiconductor chip 31 may be electrically connected to the substrate 11 and the first semiconductor chip 21 via the second lower electrodes 36, the second connection terminals 38, the first upper electrodes 27, the first TSVs 25, the first lower electrodes 26, and the first connection terminals 19.

FIGS. 23 through 28 are perspective views and system block diagrams of an electronic device according to embodiments of the inventive concepts.

Figure 23:
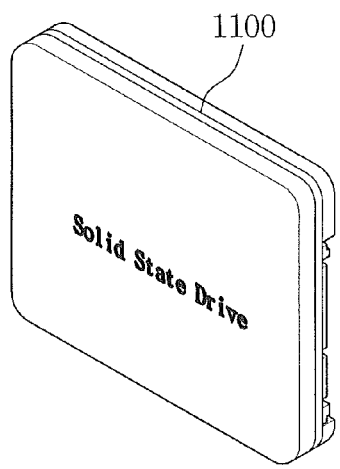
FIGS. 23 through 28 are perspective views and system block diagrams of an electronic device according to embodiments of the inventive concepts.
Figure 24:
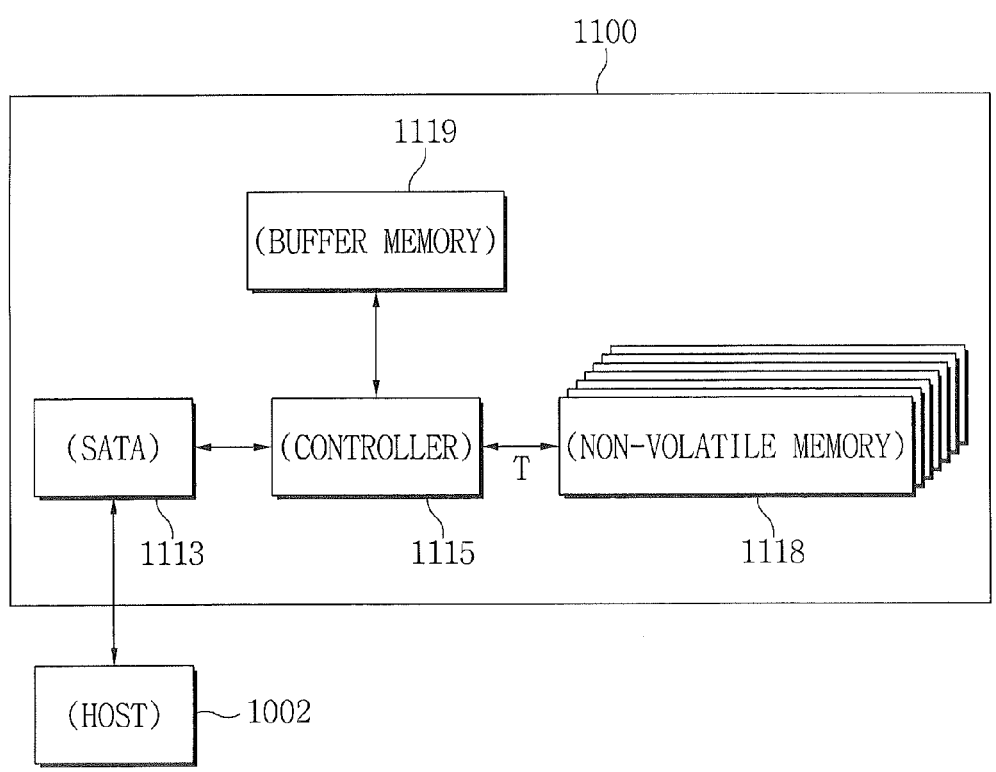

Referring to FIGS. 23 and 24, the electronic device according to the embodiments of the inventive concepts may be a data storage device, such as a solid-state drive (SSD) 1100. The SSD 1100 may include an interface 1113, a controller 1115, a non-volatile memory 1118, and a buffer memory 1119. The SSD 1100 may be a device configured to store information using a semiconductor device. As compared with a hard disk drive (HDD), the SSD 1100 may operate at high speed, reduce mechanical delay, failure rate, generation of heat, and noise, and be downscaled and made lightweight. The SSD 1100 may be applied to laptop personal computers (laptop PCs), desktop PCs, MP3 players, or portable storage devices.

The controller 1115 may be formed adjacent to and electrically connected to the interface 1113. The controller 1115 may be an MP including a memory controller and a buffer controller. The non-volatile memory 1118 may be formed adjacent to and electrically connected to the controller 1115. The SSD 1100 may have a data capacity corresponding to the non-volatile memory 1118. The buffer memory 1119 may be formed adjacent to and electrically connected to the controller 1115.

The interface 1113 may be connected to a host 1002 and serve to transmit and receive electric signals, such as data. For example, the interface 1113 may be an apparatus using a standard, such as serial advanced technology attachment (SATA), integrated drive electronics (IDE), small computer system interface (SCSI), and/or a combination thereof. The non-volatile memory 1118 may be connected to the interface 1113 via the controller 1115. The non-volatile memory 1118 may function to store data received through the interface 1113. Even if power supplied to the SSD 1100 is interrupted, the non-volatile memory 1118 may be characterized by retaining the stored data.

The buffer memory 1119 may include a volatile memory device. The volatile memory device may be a DRAM and/or a static random access memory (SRAM). The buffer memory 1119 may operate at higher speed than the non-volatile memory 1118.

Data processing speed of the interface 1113 may be higher than operation speed of the non-volatile memory 1118. Here, the buffer memory 1119 may function to temporarily store data. After data received through the interface 1113 is temporarily stored in the buffer memory 1119 through the controller 1115, the received data may be permanently stored in the non-volatile memory 1118 at a data write speed of the non-volatile memory 1118. Also, among the data stored in the non-volatile memory 1118, frequently used data may be previously read and temporarily stored in the buffer memory 1119. That is, the buffer memory 1119 may function to increase effective operating speed of the SSD 1100 and reduce error rate.

At least one of the non-volatile memory 1118, the buffer memory 1119, and the controller 1115 may have similar configurations to those described above with reference to FIGS. 1 through 22.

Figure 25:
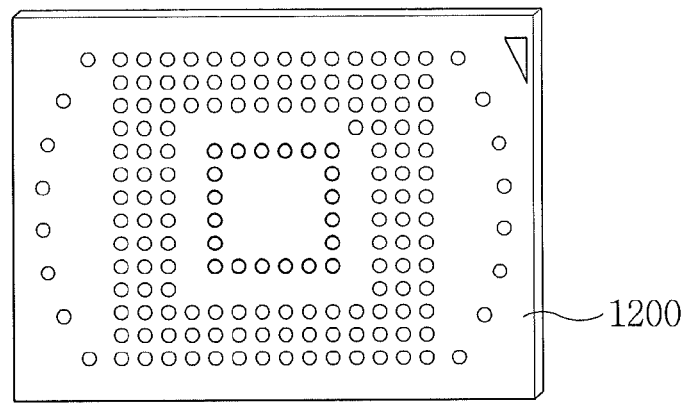
Figure 26:
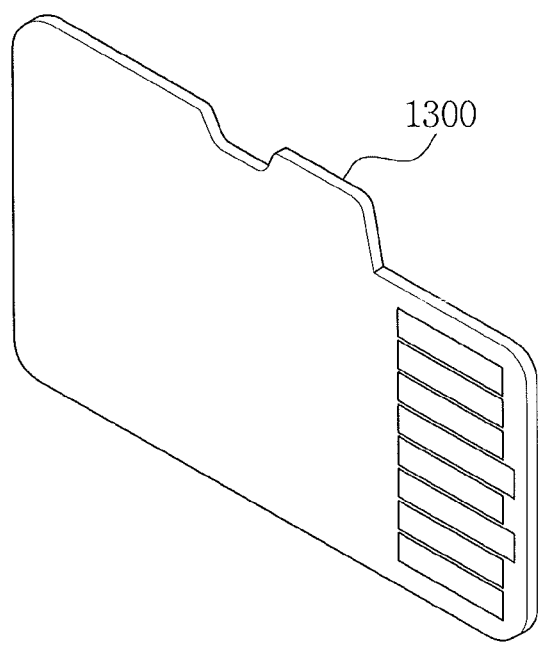
Figure 27:
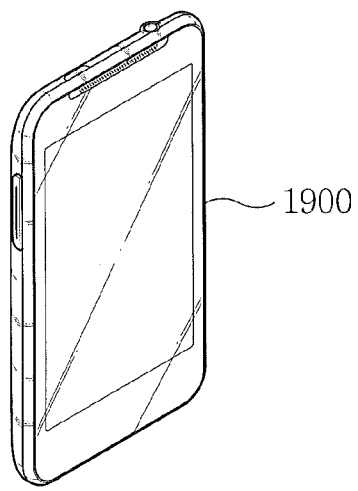

Referring to FIGS. 25 through 27, the semiconductor package described with reference to FIGS. 1 through 22 may be effectively applied to electronic systems, such as an embedded multi-media chip (eMMC) 1200, a micro-secure digital (micro SD) 1300, a smart phone 1900, a netbook, a laptop computer, or a tablet PC. For instance, a semiconductor package similar to those described above with reference to FIGS. 1 through 22 may be mounted on a mainboard of the smart phone 1900. Alternatively, a semiconductor package similar to those described above with reference to FIGS. 1 through 22 may be provided to an expansion device, such as the micro SD 1300, and combined with the smart phone 1900.

Figure 28:
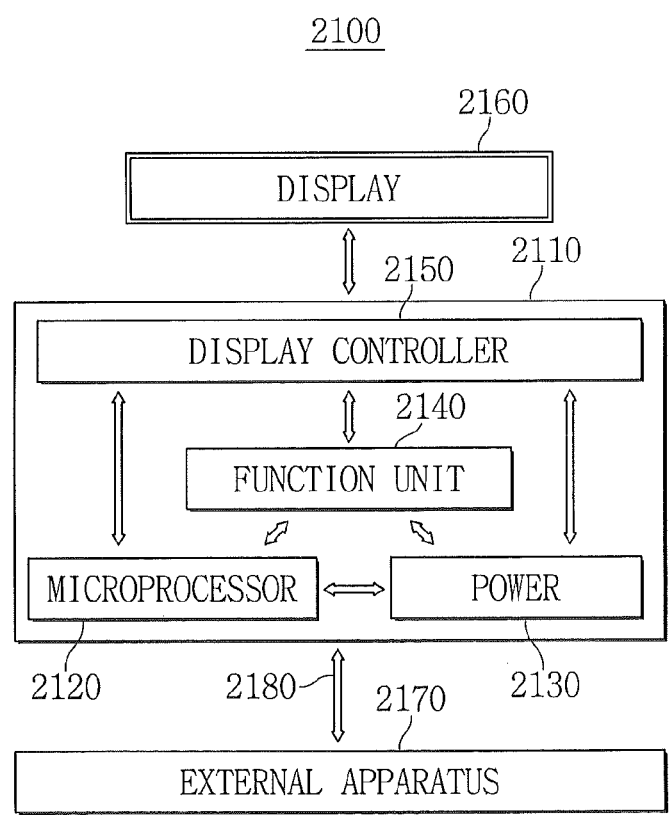

Referring to FIG. 28, a semiconductor package similar to those described above with reference to FIGS. 1 through 22 may be applied to an electronic system 2100. The electronic system 2100 may include a body 2110, an MP 2120, a power unit 2130, a function unit 2140, and/or a display controller 2150. The body 2110 may be a motherboard having a PCB. The MP 2120, the power unit 2130, the function unit 2140, and the display controller 2150 may be mounted on the body 2110. A display 2160 may be disposed on a top surface of the body 2110 or outside the body 2110. For example, the display 2160 may be disposed on a surface of the body 2110 and display an image processed by the display controller 2150.

The power unit 2130 may receive a predetermined voltage from an external power source, divide the predetermined voltage into various voltage levels, and transmit the divided voltages to the MP 2120, the function unit 2140, and the display controller 2150. The MP 2120 may receive a voltage from the power unit 2130 and control the function unit 2140 and the display 2160. The function unit 2140 may implement various functions of the electronic system 2100. For instance, when the electronic system 2100 is a mobile electronic product, such as a portable phone, the function unit 2140 may include several elements capable of wireless communication functions, such as output of an image to the display 2160 or output of a voice to a speaker, by dialing or communication with an external device 2170. When the function unit 2140 includes a camera, the function unit 2140 may serve as an image processor.

In applied embodiments, when the electronic system 2100 is connected to a memory card to increase capacity, the function unit 2140 may be a memory card controller. The function unit 2140 may exchange signals with the external device 2170 through a wired or wireless communication unit 2180. In addition, when the electronic system 2100 needs a universal serial bus (USB) to expand functions thereof, the function unit 2140 may serve as an interface controller. The function unit 2140 may include a mass storage device.

A semiconductor package similar to those described with reference to FIGS. 1 through 22 may be applied to the function unit 2140 or the MP 2120.

According to embodiments of the inventive concepts, an adhesive layer may be formed between a lower semiconductor chip and an upper semiconductor chip. Connection terminals may be formed through the adhesive layer. Side surfaces of the adhesive layer may be aligned with side surfaces of the upper semiconductor chip. The upper semiconductor chip may be electrically connected to a substrate via the connection terminals and TSVs formed in the lower semiconductor chip. The embodiments of the inventive concepts can embody a semiconductor package, which can simplify forming processes and precisely adhere the upper and lower semiconductor chips to each other.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concepts as defined in the claims. In the claims, means-plus-function clauses are intended to cover the structures described herein as performing the recited function, and not only structural equivalents but also equivalent structures.

What is claimed is:

1. A semiconductor package comprising:
a substrate;
a first semiconductor chip on the substrate and having a plurality of through-silicon vias (TSVs);
a second semiconductor chip on the first semiconductor chip remote from the substrate, and having an active layer;
an adhesive layer between the first semiconductor chip and the active layer;
connection terminals extending through the adhesive layer and connected to the TSVs and the active layer,
wherein side surfaces of the adhesive layer are aligned with side surfaces of the second semiconductor chip; and
upper electrodes between the TSVs and the connection terminals, the upper electrodes being in contact with the connection terminals through the adhesive layer,
wherein a respective upper electrode has an upper portion having a smaller horizontal width than a lower portion thereof.

2. The semiconductor package of claim 1, wherein the side surfaces of the adhesive layer are vertically aligned with the side surfaces of the second semiconductor chip.

3. The semiconductor package of claim 1, wherein the second semiconductor chip has a greater horizontal width than or the same horizontal width as the first semiconductor chip, and
the adhesive layer has the same horizontal width as the second semiconductor chip.

4. The semiconductor package of claim 1, wherein the second semiconductor chip has a smaller horizontal width than the first semiconductor chip, and
the adhesive layer includes a protrusion extending outside the second semiconductor chip.

5. The semiconductor package of claim 4, wherein the protrusion of the adhesive layer extends to a higher level than a bottom end of the second semiconductor chip, and
wherein the protrusion of the adhesive layer is spaced apart from side surfaces of the second semiconductor chip.

6. The semiconductor package of claim 1, wherein the connection terminals are in contact with top surfaces and side surfaces of the upper electrodes.

7. The semiconductor package of claim 1, further comprising lower electrodes between the connection terminals and the active layer, the lower electrodes being in contact with the connection terminals.

8. The semiconductor package of claim 7, wherein the adhesive layer is in contact with side surfaces of the connection terminals and the lower electrodes.

9. The semiconductor package of claim 1, further comprising pores between the adhesive layer and the active layer,
wherein the pores are near the connection terminals, and side surfaces of the connection terminals are exposed within the pores.

10. The semiconductor package of claim 1, further comprising:
a thermal interface material (TIM) layer on the second semiconductor chip; and
a heat slug on the TIM layer.

11. A semiconductor package comprising:
a substrate;
a first semiconductor chip on the substrate and having a plurality of through-silicon vias (TSVs);
a second semiconductor chip on the first semiconductor chip remote from the substrate, and having an active layer;
an adhesive layer between the first semiconductor chip and the active layer;
connection terminals extending through the adhesive layer and connected to the TSVs and the active layer,
wherein side surfaces of the adhesive layer are aligned with side surfaces of the second semiconductor chip,
an under-fill material between the substrate and the first semiconductor chip; and
lower connection terminals connected to the substrate and the TSVs through the under-fill material.

12. A semiconductor package comprising:
a substrate;
a first semiconductor chip on the substrate and having a plurality of conductive vias extending therethrough;
a second semiconductor chip on the first semiconductor chip remote from the substrate, the second semiconductor chip being wider than the first semiconductor chip;
an adhesive layer on the second semiconductor chip and extending on the second semiconductor chip beyond the first semiconductor chip;
a plurality of first electrodes in the adhesive layer that electrically connect the second semiconductor chip to the plurality of conductive vias that extend through the first semiconductor chip; and
a plurality of second electrodes on the first semiconductor chip adjacent the second semiconductor chip, a respective one of which is connected to a respective one of the conductive vias and a respective one of the first electrodes, the respective second electrodes having nonplanar surfaces adjacent the respective first electrodes and the respective first electrodes having planar surfaces adjacent the respective second electrodes.

13. The semiconductor package of claim 12 wherein the adhesive layer extends on the second semiconductor chip to align with a side of the second semiconductor chip.

14. The semiconductor package of claim 12 wherein the second electrodes comprise a base and a protrusion extending from the base towards the respective first electrodes, the protrusion being narrower than the base.

15. The semiconductor package of claim 14 further comprising a plurality of conductive bumps, a respective one of which is between a respective one of the first electrodes and a respective one of the second electrodes.

16. The semiconductor package of claim 12 wherein the first semiconductor chip is a logic chip and the second semiconductor chip is a memory chip.

* * * * *